(12) United States Patent
Yi et al.

(10) Patent No.: US 11,503,730 B2
(45) Date of Patent: Nov. 15, 2022

(54) CONNECTOR WITH MEMORY CARD

(71) Applicants: TE Connectivity Services GmbH, Schaffhausen (CH); Tyco Electronics (Shanghai) Co., Ltd., Shanghai (CN)

(72) Inventors: Chong Hun Yi, Mechanicsburg, PA (US); Tom Morris, Johnson City, TN (US); Pai B. Ramachandra Rajendra, Shanghai (CN); Lei Pan, Shanghai (CN); Stephen J. Descioli, Louisville, KY (US)

(73) Assignee: TE Connectivity Solutions GmbH, Schaffhausen (CH)

( * ) Notice: Subject to any disclaimer, the term of this patent is extended or adjusted under 35 U.S.C. 154(b) by 324 days.

(21) Appl. No.: 16/848,210

(22) Filed: Apr. 14, 2020

(65) Prior Publication Data

US 2020/0359516 A1 Nov. 12, 2020

Related U.S. Application Data

(60) Provisional application No. 62/844,901, filed on May 8, 2019.

(51) Int. Cl.
*H05K 5/02* (2006.01)
*G06F 13/38* (2006.01)
(Continued)

(52) U.S. Cl.
CPC ......... *H05K 5/0286* (2013.01); *G06F 13/385* (2013.01); *G06K 19/07732* (2013.01); *H01R 12/721* (2013.01); *H01R 13/502* (2013.01); *H05K 1/0295* (2013.01); *H05K 1/117* (2013.01); *H05K 2201/10159* (2013.01)

(58) Field of Classification Search
CPC ............ G06F 13/385; G06K 19/07732; H05K 1/0295
See application file for complete search history.

(56) References Cited

U.S. PATENT DOCUMENTS 3,966,290 A * 6/1976 Little .................. H01R 12/727
439/74
4,329,008 A * 5/1982 Braginetz .......... G01R 1/06788
439/747

(Continued)

FOREIGN PATENT DOCUMENTS

WO 98/28823 A1 7/1998

OTHER PUBLICATIONS

European Search Report, dated Jul. 8, 2020, EP 20 17 2568, European Application No. 20172568.6-1201.

*Primary Examiner* — Neil Abrams

(57) ABSTRACT

A plug-in connector having terminal provided in terminal receiving cavities. The terminals have memory card engagement sections. A memory card receiving slot is provided in the housing. The memory card receiving slot spans the terminal receiving cavities. A portion of the memory card receiving slot is in alignment with each of the terminal receiving cavities. An elongated opening extends between the memory card receiving slot and the terminal receiving cavities. A memory card is positioned in the memory card receiving slot. The memory card stores data which is identifiable to the specific device and allows the data to be easily conveyed.

19 Claims, 3 Drawing Sheets

(51) Int. Cl.
*G06K 19/077* (2006.01)
*H01R 12/72* (2011.01)
*H01R 13/502* (2006.01)
*H05K 1/02* (2006.01)
*H05K 1/11* (2006.01)

(56) References Cited

U.S. PATENT DOCUMENTS

| | | | | |
|---|---|---|---|---|
| 4,380,360 | A * | 4/1983 | Parmer | G06F 1/183 439/59 |
| 4,397,513 | A * | 8/1983 | Clark | H01R 12/716 439/490 |
| 4,464,832 | A * | 8/1984 | Asick | H05K 3/326 439/70 |
| 4,518,211 | A * | 5/1985 | Stepan | H05K 7/1417 439/74 |
| 5,161,169 | A * | 11/1992 | Galano | H05K 5/026 375/220 |
| 5,577,937 | A * | 11/1996 | Itoh | H01R 13/6625 439/620.22 |
| 5,627,729 | A * | 5/1997 | Oldendorf | H05K 5/0269 439/946 |
| 5,896,274 | A * | 4/1999 | Ishida | H05K 5/0269 439/946 |
| 6,109,939 | A * | 8/2000 | Kondo | G06K 19/07739 439/140 |
| 6,129,561 | A * | 10/2000 | Lok | H01R 24/64 439/903 |
| 6,250,934 | B1 * | 6/2001 | Eskildsen | H01R 13/22 439/71 |
| 6,276,943 | B1 * | 8/2001 | Boutros | H01R 13/6658 439/76.1 |
| 6,290,513 | B1 * | 9/2001 | Kakinoki | G06K 7/0047 439/95 |
| 6,334,781 | B1 * | 1/2002 | Nishio | H01R 13/6315 439/248 |
| 7,232,329 | B1 | 6/2007 | Wu | |
| 7,927,148 | B2 * | 4/2011 | Chang | H01R 13/6658 439/620.16 |
| 10,505,311 | B2 * | 12/2019 | Al-Ali | A61B 5/303 |
| 2005/0059273 | A1 | 3/2005 | Chiou et al. | |
| 2011/0281446 | A1 | 11/2011 | Yu | |
| 2012/0052728 | A1 | 3/2012 | Lu et al. | |
| 2014/0273566 | A1 | 9/2014 | Allgood et al. | |
| 2020/0359516 | A1 * | 11/2020 | Yi | H05K 5/0286 |

* cited by examiner

US 11,503,730 B2

CONNECTOR WITH MEMORY CARD

FIELD OF THE INVENTION

The present invention is directed a connector for connecting a memory card to a printed circuit board or cable assembly. In particular, the invention is directed to a plug-in connector which includes an electrically erasable programmable read-only memory (EEPROM) device.

BACKGROUND OF THE INVENTION

Devices and systems often require date to be gathered for service or technical support. Today, data is gathered in various ways and subject to interpretation of the device being recorded leaving data sometimes very subjective.

It would, therefore, be beneficial to provide a cost-effective, pluggable electrical connector which incorporates a memory card, such as an EEPROM device, which allows for the storage of data which is specific or personally identifiable to the device and which allows information to be easily conveyed, thereby facilitating trouble shooting and repair of the device.

SUMMARY OF THE INVENTION

An embodiment is directed to a plug-in connector having a housing with a memory card which stores data which is identifiable to the specific device and which allows the data to be easily conveyed. At least one latch is provided on the housing. The at least one latch cooperates with a mating connector to maintain the plug-in connector in position relative to the mating connector.

An embodiment is directed to a plug-in connector having a housing with a top wall, a bottom wall and side walls. Terminal receiving cavities are provided in the housing and extend from the top wall of the housing toward the bottom wall. Terminals are provided in the terminal receiving cavities. The terminals have memory card engagement sections. A memory card receiving slot is provided in the housing. The memory card receiving slot extends from the top wall toward the bottom wall and spans the terminal receiving cavities. A portion of the memory card receiving slot is in alignment with each of the terminal receiving cavities. An elongated opening extends between the memory card receiving slot and the terminal receiving cavities. A memory card is positioned in the memory card receiving slot. The memory card stores data which is identifiable to the specific device and allows the data to be easily conveyed.

Other features and advantages of the present invention will be apparent from the following more detailed description of the preferred embodiment, taken in conjunction with the accompanying drawings which illustrate, by way of example, the principles of the invention.

DETAILED DESCRIPTION OF THE INVENTION

Figure 1:
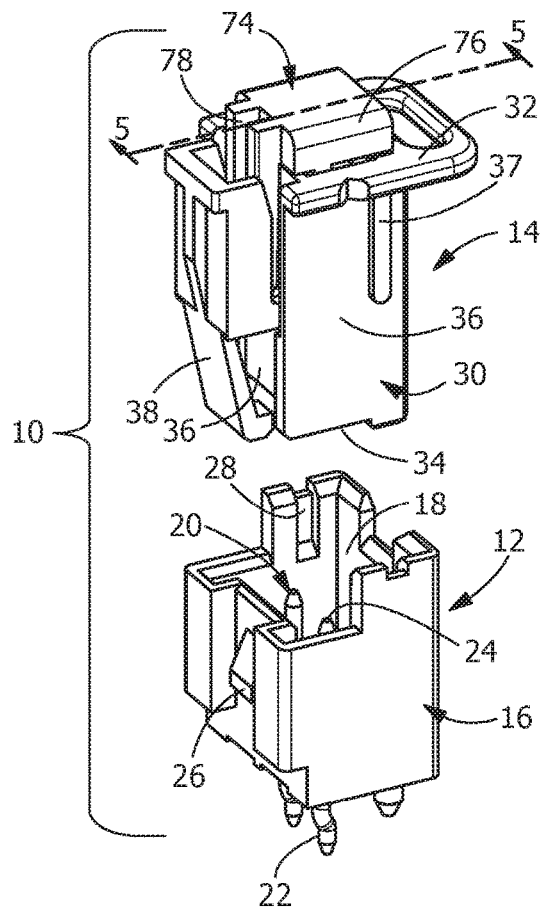
FIG. 1 is a perspective view of an illustrative connector assembly with a plug connector exploded from the receptacle connector.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise.

Moreover, the features and benefits of the invention are illustrated by reference to the preferred embodiments. Accordingly, the invention expressly should not be limited to such embodiments illustrating some possible non-limiting combination of features that may exist alone or in other combinations of features, the scope of the invention being defined by the claims appended hereto.

As best shown in FIG. 1, an illustrative connector assembly 10 has a receptacle connector 12 and a plug or plug-in connector 14. The receptacle connector 12 has a housing 16 with a plug receiving recess 18 which extends therein. Keying slots 28 are provided in the plug receiving recess 18.

Contact pins 20 are provided in the housing 16. The contact pins 20 have circuit board mating portions 22 which extend outside of the housing 16, and plug connector mating portions 24 which extend into the plug receiving recess 18. The circuit board mating portions 22 are configured to be inserted into through holes of a substrate or printed circuit board (not shown). Other configurations of the circuit board mating portions 22 can be used without departing from the scope of the invention. A latch receiving projection 26 is provided on the housing 16.

As best shown in FIGS. 2 through 5, plug or plug-in connector 14 has a housing 30 with a top wall 32, and oppositely facing bottom wall 34 and side walls 36 which extend between the top wall 32 and the bottom wall 34. Keying projections 37 are provided on respective side walls 36. A latch 38 is provided on a respective side wall 36. A cover retention member 40 (FIG. 4) also extends from the respective side wall 36 proximate the latch 38.

Terminal receiving cavities 42 extend through the plug connector 14 from the top wall 32 toward the bottom wall 34. Longitudinal axes of the terminal receiving cavities 42 are parallel to the longitudinal axis of the housing 30 of the plug connector 14. In the embodiment shown, two terminal receiving cavities 42 are provided. However, other number of terminal receiving cavities 42 may be provided without departing from the scope of the invention. Pin receiving openings 44 extend through the bottom wall (FIGS. 3 and 5) and are positioned in alignment with the terminal receiving cavities 42.

Figure 2:
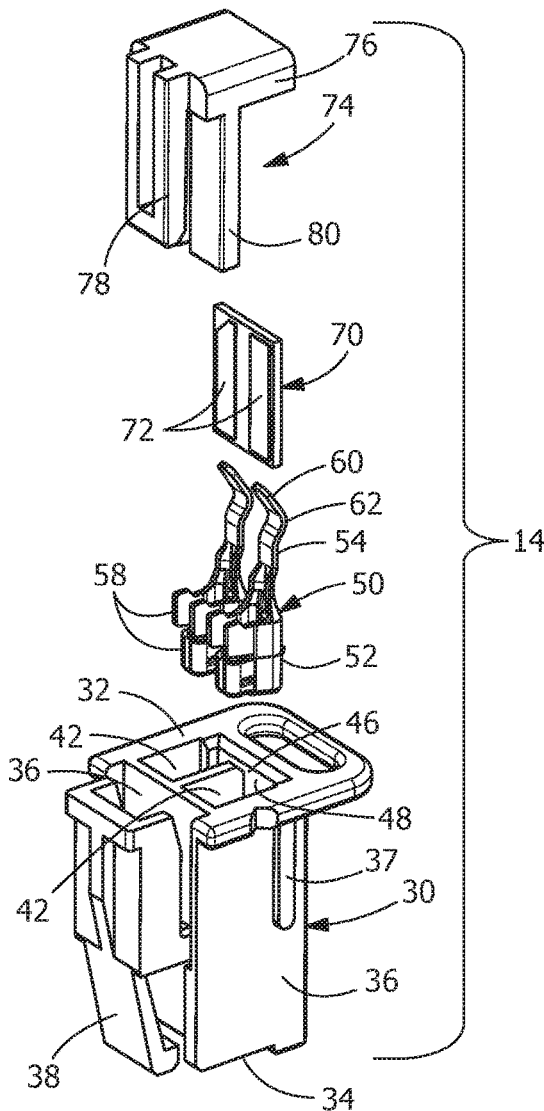
FIG. 2 is an exploded perspective view of an illustrative plug connector of the present invention.
Figure 3:
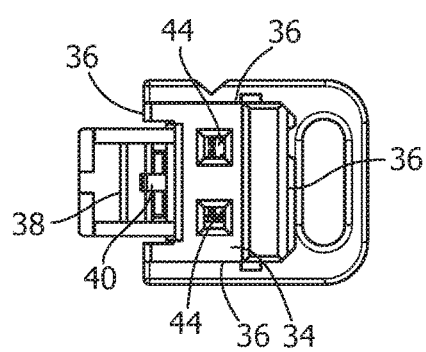
FIG. 3 is a bottom view of the plug connector of FIG. 2.
Figure 4:
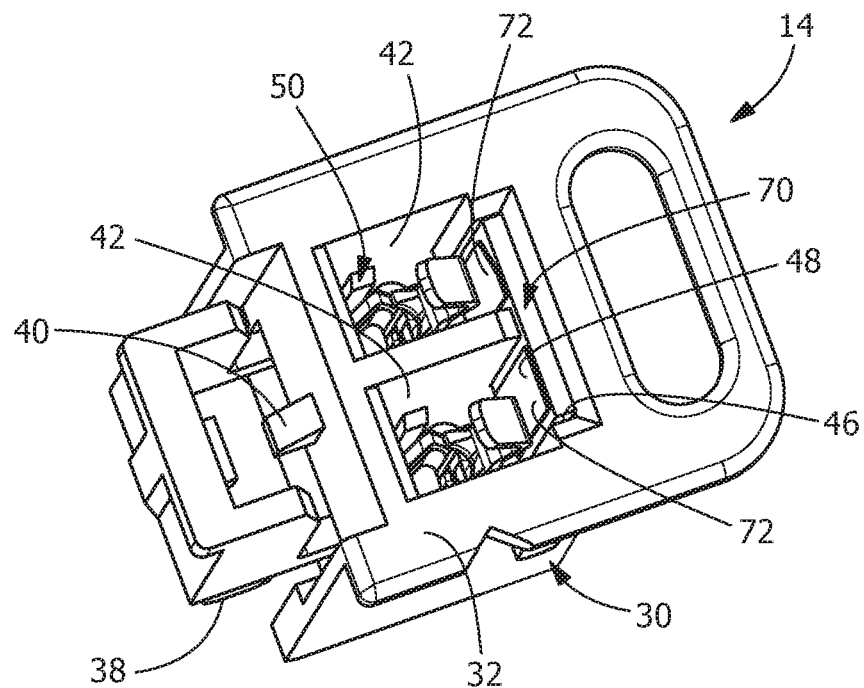
FIG. 4 is a top perspective view of the plug connector of FIG. 2, with the cover removed.

A memory card receiving slot 46 extends from the top wall 32 of the plug connector 14 toward the bottom wall 34. The longitudinal axis of the memory card receiving slot 46 is parallel to the longitudinal axis of the housing 30 of the plug connector 14 and parallel to the longitudinal axes of the terminal receiving cavities 42. As best shown in FIG. 2, the memory card receiving slot 46 spans the terminal receiving cavities 42, such that a portion of the memory card receiving slot 46 is in alignment with each of the terminal receiving cavities 42. An elongated opening 48 extends between the memory card receiving slot 46 and the terminal receiving cavities 42.

Terminals 50 are positioned in the terminal receiving cavities 42. The terminals 50 have contact pin receiving sections 52 and memory card engagement sections 54. The contact pin receiving sections 52 have longitudinal extending openings 56 (FIG. 5) for receipt of the plug connector mating portions 24 the contact pins 20 therein. The contact pin receiving sections 52 also have projections or shoulders 58 which cooperate with the walls of the terminal receiving cavities 42 to retain and stabilize the terminals 50 in the terminal receiving cavities 42. The retention can occur by latching, press fit, material displacement or other known methods for retaining terminals in the terminal receiving cavities.

The memory card engagement sections 54 are resilient contact arms which extend from the contact pin receiving sections 52. The memory card engagement sections 54 have arcuate configurations to provide lead-in surfaces 60 and contact sections 62. The contact sections 62 are configured to make mechanical and electrical connection with a memory card 70.

The memory card 70 is positioned in the memory card receiving slot 46. The memory card 70 may be, but is not limited to, an electrically erasable programmable read-only memory (EEPROM) device. The memory card 70 has contact pads 72 which are configured to engage the memory card engagement sections 54 of the terminals 50.

Figure 5:
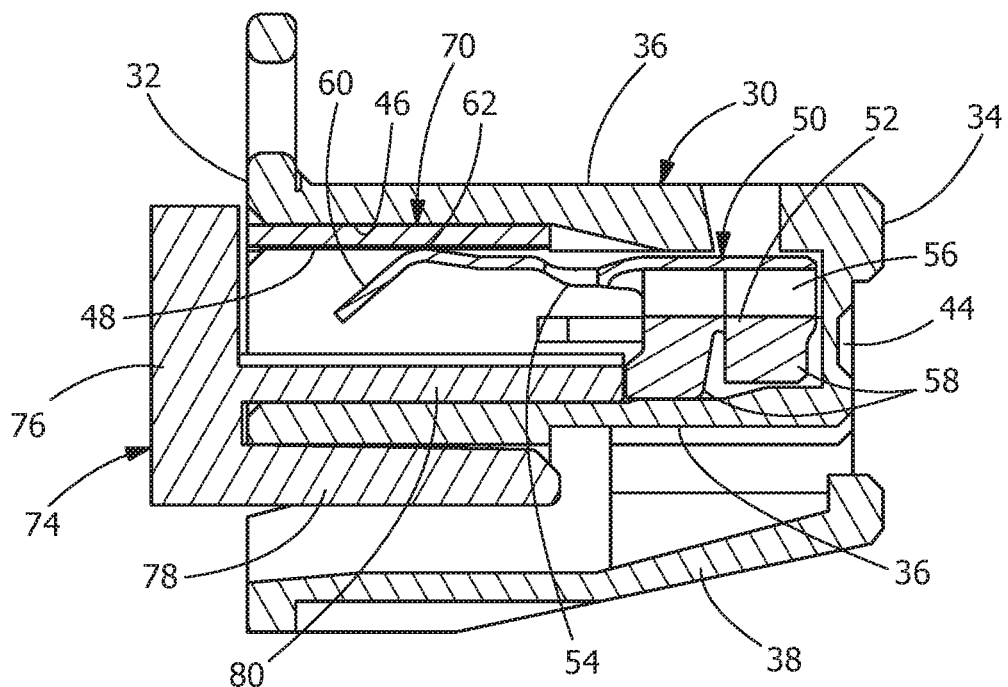
FIG. 5 is a cross-sectional view of the plug connector, taken along line 5-5 of FIG. 1.

A cover 74, as best shown in FIGS. 2 and 5, has a top planar member 76 with cover latching member 78 and terminal position assurance members 80 extending therefrom. The longitudinal axis of the cover latching member 78 and the terminal position assurance members are parallel to the longitudinal axis of the housing 30 of the plug connector 14 and parallel to the longitudinal axes of the terminal receiving cavities 42.

During assembly of the plug connector 14, the terminals 50 are inserted into the terminal receiving cavities 42 and retained therein as previously described. In this position, the memory card engagement sections 54, and in particular, the contact sections 62, are not stressed and extend through the elongated opening 48 into the memory card receiving slot 46.

With the terminals 50 properly positioned, the memory card 70 is inserted into the memory card receiving slot 46 through the top wall 32 of the housing 30 of the plug connector 14. As this occurs, the memory card 70 engages the lead-in surface 60 of the memory card engagement sections 54, causing the memory card engagement sections 54 to move to a stressed position. The continued insertion of the member card 70 causes the contact sections 62 of the memory card engagement sections 54 to engage and move across the contact pads 72 of the memory card 70. As the memory card engagement sections 54 are in a stressed position, the contact sections 62 exert a force on the contact pads 72, causing the contact sections 62 to create a wiping action across the contact pads 72, thereby facilitating a reliable electrical connection between the contact sections 62 and the contact pads 72. With the memory card 70 fully inserted, the contact sections 62 remain in mechanical and electrical contact with the contact pads 72. In other illustrative embodiments, the memory card 70 may also have latches or other known retention device to retain the memory card 70 in the memory card receiving slot 46.

With the memory card 70 properly inserted into the housing 30 of the plug connector 14, the cover 74 is moved into position. In the fully inserted position, the cover latching member 78 is position under the latch 38 and cooperates with the cover retention member 40 to retain the cover 74 in position on the housing 30. In this position, the terminal position assurance members 80 of the cover are positioned proximate to or in contact with the projections or shoulders 58 of the terminals 50. If the terminals 50 are not properly positioned in the terminal receiving cavities 42, the terminal position assurance members 80 engage the projections or shoulders 58 of the terminals 50 to move them into position as the cover 80 is moved to the fully inserted position. Alternatively, if the terminals 50 are not properly positioned in the terminal receiving cavities 42 and are prevented from being properly positioned, the engagement of the terminal position assurance members 80 with the projections or shoulders 58 of the terminals 50 will prevent the proper insertion of the cover 80, thereby providing a visual indication that the terminals 50 are not properly positioned.

With the cover 80 properly positioned, the top planar member covers the terminal receiving cavities 42 and the member card receiving slot 46 to prevent the removal of or damage to the terminals 50 and the memory card 70.

With the plug connector 14 fully assembled, the plug connector 14 is inserted into the plug receiving recess 18 of the receptacle connector 18. As this occurs, the keying projections 37 are moved into the keying slots 28. With the plug connector 14 properly aligned with the receptacle connector 18, the contact pins 20 are inserted through the pin receiving openings 44 in the bottom wall 24 of the housing 30 and into the opening 56 of the contact pin receiving sections 52 of the terminals 50. In the fully assembled position, the latch 38 of the plug connector 14 cooperates with the latch receiving projection 26 of the receptacle connector 12 to retain the plug connector 14 in the plug receiving recess 18 of the receptacle connector 18.

Figure 6:
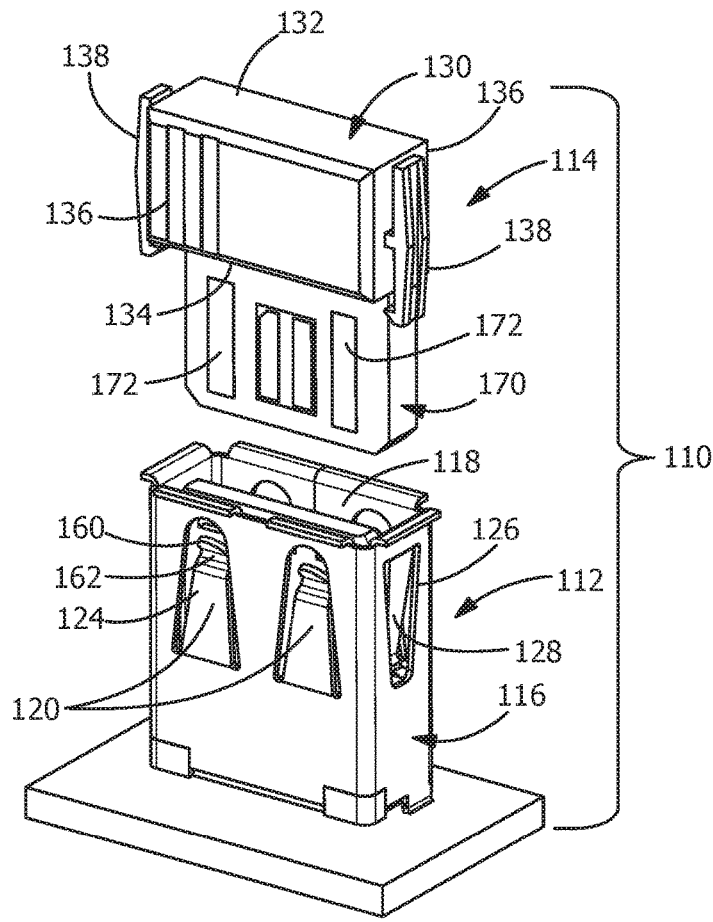
FIG. 6 is a perspective view of an alternate illustrative embodiment of the connector assembly with an alternate plug connector exploded from the alternate receptacle connector.
Figure 7:
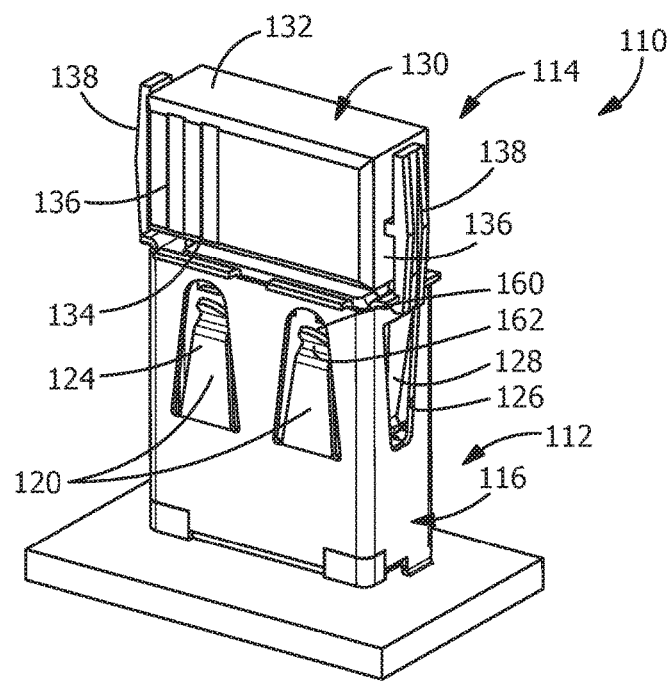
FIG. 7 is a perspective view of the connector assembly of FIG. 6 in the fully assembled position.

Referring to FIGS. 6 and 7, an alternate illustrative embodiment is shown. In this embodiment, the illustrative connector assembly 110 has a receptacle connector 112 and a plug or plug-in connector 114. The receptacle connector 112 has a housing 116 with a plug receiving recess 118 which extends therein. Resilient contact arms 120 are provided integral with the housing 116. The contact arms 120 have memory card engagement portions 124 which extend into the plug receiving recess 118. Latch receiving recesses 126 with resilient latch receiving arms 128 are provided on the housing 116. In the embodiment shown, the receptacle connector 112 is a universal serial bus (USB) connector.

The plug or plug-in connector 114 has a housing 130 with a top wall 132, and oppositely facing bottom wall 134 and side walls 136 which extend between the top wall 132 and the bottom wall 134. Latches 138 are provided on respective side walls 136.

A portion of a memory card 170 extends from the bottom wall 134 of the housing 130. A top portion of the memory card 170 is retained or embedded in the housing, such as for example, by overmolding the housing 130 over a portion of the memory card 170. The memory card 170 may be, but is not limited to, an EEPROM device. The memory card 170 has contact pads 172 which are configured to engage the memory card engagement portions 124 of the resilient contact arms 120 of the receptacle connector 112.

During insertion of the plug connector 114 into the receptacle connector 112, the memory card 170 is inserted into the plug receiving recess 118. As this occurs, the memory card 170 engages the lead-in surface 160 the memory card engagement portions 124 of the resilient contact arms 120, causing the memory card engagement portions 124 to move to a stressed position. The continued insertion of the member card 170 causes contact sections 162 of the memory card engagement portions 124 to engage and move across the contact pads 172 of the memory card 170. As the memory card engagement portions 124 of the resilient contact arms 120 are in a stressed position, the contact sections 162 exert a force on the contact pads 172, causing the contact sections 162 to create a wiping action across the contact pads 172, thereby facilitating a reliable electrical connection between the contact sections 162 and the contact pads 172. With the memory card 170 fully inserted, the contact sections 162 remain in mechanical and electrical contact with the contact pads 172.

In the fully assembled position, the latches 138 of the plug connector 114 cooperate with the resilient latch receiving arms 128 of the receptacle connector 112 to retain the plug connector 114 in the plug receiving recess 118 of the receptacle connector 118. In various embodiments, the receptacle connector 112 is positioned in a substrate or printed circuit board (not shown) to allow the memory card 170 to be in electrical communication with the substrate or printed circuit board.

The use of a connector which incorporates a memory card allows for the storage of data which is specific or personally identifiable to the device or system to which the connector is electrically connected.

While the invention has been described with reference to a preferred embodiment, it will be understood by those skilled in the art that various changes may be made and equivalents may be substituted for elements thereof without departing from the spirit and scope of the invention as defined in the accompanying claims. One skilled in the art will appreciate that the invention may be used with many modifications of structure, arrangement, proportions, sizes, materials and components and otherwise used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims, and not limited to the foregoing description or embodiments.

We claim:

1. A plug-in connector comprising:
   a housing having a memory card which stores data which is identifiable to the specific device and which allows the data to be easily conveyed;
   at least one latch provided on the housing, the at least one latch cooperates with a mating connector to maintain the plug-in connector in position relative to the mating connector;
   terminal receiving cavities provided in the housing and extending from a top wall of the housing toward a bottom wall of the housing, longitudinal axes of the terminal receiving cavities being parallel to a longitudinal axis of the housing;
   a cover cooperating with the housing, the cover having a planar member with a cover latching member and terminal position assurance members extending therefrom.

2. The plug-in connector as recited in claim 1, wherein the memory card is an electrically erasable programmable read-only memory device.

3. The plug-in connector as recited in claim 1, wherein pin receiving openings extend through the bottom wall of the housing and are positioned in alignment with the terminal receiving cavities.

4. The plug-in connector as recited in claim 3, wherein a memory card receiving slot is provided in the housing, the memory card receiving slot extends from the top wall toward the bottom wall, a longitudinal axis of the memory card receiving slot is parallel to the longitudinal axis of the housing and parallel to the longitudinal axes of the terminal receiving cavities.

5. The plug-in connector as recited in claim 4, wherein the memory card receiving slot spans the terminal receiving cavities, a portion of the memory card receiving slot is in alignment with each of the terminal receiving cavities, an elongated opening extends between the memory card receiving slot and the terminal receiving cavities.

6. The plug-in connector as recited in claim 5, wherein terminals are positioned in the terminal receiving cavities, the terminals have memory card engagement sections, the memory card engagement sections are resilient contact arms, the memory card engagement sections have lead-in surfaces and contact sections, the contact sections are provided in mechanical and electrical connection with the memory card.

7. The plug-in connector as recited in claim 6, wherein the terminals have contact pin receiving sections, the contact pin receiving sections have longitudinal extending openings for receipt of plug connector mating portions of mating contact pins of the mating connector.

8. The plug-in connector as recited in claim 7, wherein the contact pin receiving sections have projections which cooperate with walls of the terminal receiving cavities to retain and stabilize the terminals in the terminal receiving cavities.

9. The plug-in connector as recited in claim 8, wherein the memory card has contact pads which are configured to engage the memory card engagement sections of the terminals.

10. The plug-in connector as recited in claim 1, wherein the at least one latch is provided on a respective side wall of the housing.

11. The plug-in connector as recited in claim 10, wherein a cover retention member extends from the respective side wall of the housing proximate the at least one latch.

12. The plug-in connector as recited in claim 1, wherein keying projections extends from respective side walls of the housing.

13. A plug-in connector comprising:
   a housing having a top wall, a bottom wall and side walls;

terminal receiving cavities provided in the housing and extending from the top wall of the housing toward the bottom wall;

terminals provided in the terminal receiving cavities, the terminals having memory card engagement sections;

a memory card receiving slot provided in the housing, the memory card receiving slot extending from the top wall toward the bottom wall, the memory card receiving slot spanning the terminal receiving cavities, a portion of the memory card receiving slot being in alignment with each of the terminal receiving cavities, an elongated opening extending between the memory card receiving slot and the terminal receiving cavities;

a memory card positioned in the memory card receiving slot, the memory card storing data which is identifiable to the specific device and allowing the data to be easily conveyed.

14. The plug-in connector as recited in claim 13, wherein the memory card is an electrically erasable programmable read-only memory device.

15. The plug-in connector as recited in claim 14, wherein the memory card engagement sections of the terminals are resilient contact arms, the memory card engagement sections have lead-in surfaces and contact sections, the contact sections are provided in mechanical and electrical connection with a memory card.

16. The plug-in connector as recited in claim 15, wherein the terminals have contact pin receiving sections, the contact pin receiving sections have longitudinal extending openings for receipt of plug connector mating portions of mating contact pins of the mating connector, the contact pin receiving sections have projections which cooperate with walls of the terminal receiving cavities to retain and stabilize the terminals in the terminal receiving cavities.

17. The plug-in connector as recited in claim 16, wherein the memory card has contact pads which engage the memory card engagement sections of the terminals.

18. The plug-in connector as recited in claim 17, wherein a cover cooperates with the housing, the cover has a planar member with a cover latching member and terminal position assurance members extending therefrom.

19. The plug-in connector as recited in claim 18, wherein at least one latch is provided on the housing, the at least one latch cooperates with a mating connector to maintain the plug-in connector in position relative to the mating connector.

* * * * *